(12) United States Patent
Park et al.

(10) Patent No.: US 7,288,422 B2
(45) Date of Patent: Oct. 30, 2007

(54) PHOTONIC INTEGRATED DEVICE USING REVERSE-MESA STRUCTURE AND METHOD FOR FABRICATING THE SAME

(75) Inventors: Byeong-Hoon Park, Yongin-si (KR);
Yu-Dong Bae, Suwon-si (KR); In Kim, Suwon-si (KR); Byung-Kwon Kang, Suwon-si (KR); Young-Hyun Kim, Suwon-si (KR); Sang-Moon Lee, Suwon-si (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 270 days.

(21) Appl. No.: 10/991,614

(22) Filed: Nov. 18, 2004

(65) Prior Publication Data

US 2005/0259708 A1    Nov. 24, 2005

(30) Foreign Application Priority Data

May 20, 2004    (KR)    .................. 10-2004-0035994

(51) Int. Cl.
*H01L 21/00*    (2006.01)
(52) U.S. Cl. .......................... 438/32; 438/39; 438/40; 257/E33.01
(58) Field of Classification Search ................. 438/32, 438/39, 40; 257/E33.011
See application file for complete search history.

(56) References Cited

U.S. PATENT DOCUMENTS

| | | | | |
|---|---|---|---|---|
| 5,543,353 A | * | 8/1996 | Suzuki et al. | ................. 438/31 |
| 6,187,515 B1 | * | 2/2001 | Tran et al. | ................... 430/321 |
| 6,821,801 B1 | * | 11/2004 | Sato et al. | ..................... 438/22 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 539-542.*

* cited by examiner

*Primary Examiner*—William M. Brewster
(74) *Attorney, Agent, or Firm*—Cha & Reiter, LLC

(57) ABSTRACT

A photonic integrated device using a reverse-mesa structure and a method for fabricating the same are disclosed. The photonic integrated device includes a first conductive substrate on which a semiconductor laser, an optical modulator, a semiconductor optical amplifier, and a photo detector are integrated, a first conductive clad layer and an active layer sequentially formed on the first conductive substrate in the form of a mesa structure, a second conductive clad layer formed on the active layer in the form of a reverse-mesa structure, an ohmic contact layer formed on the second clad layer in such a manner that the ohmic contact layer has a width narrower than the width of an upper surface of the second conductive clad layer, a current shielding layer filled in a sidewall having a mesa and reverse-mesa structure, and at least one window area formed between the above elements.

13 Claims, 7 Drawing Sheets

PHOTONIC INTEGRATED DEVICE USING REVERSE-MESA STRUCTURE AND METHOD FOR FABRICATING THE SAME

CLAIM OF PRIORITY

This application claims priority to an application entitled "Photonic integrated device using a reverse-mesa structure and a method for fabricating the same," filed with the Korean Intellectual Property Office on May 20, 2004 and assigned Serial No. 2004-35994, the contents of which are hereby incorporated by reference.

BACKGROUND OF THE INVENTION

1. Field of the Invention

The present invention relates to a photonic integrated device and, more particularly, to a photonic integrated device using a reverse-mesa structure and a method for fabricating the same, which is capable of simplifying a fabricating process for the photonic integrated device while reducing serial resistance of the device.

2. Description of the Related Art

Recently, research and studies have been actively carried out for integrating various optical devices having various functions onto a substrate in order to realize a photonic integrated circuit. In particular, an amplifier and modulator integrated distributed-feedback laser diode (hereinafter, simply referred to as "AML"), in which a semiconductor laser, an optical modulator, a semiconductor optical amplifier and a photo detector are integrated onto a single substrate, has become a matter of concern and interest.

FIG. 1 is a sectional view showing a conventional AML device having a buried hetero (BH) structure. As shown, the conventional AML device includes an n-InP clad layer 1, an active layer 2, an i-n current shielding layer 3, p-InP clad layer 4, a contact layer 5, and an insulating layer 6. Generally, the p-InP clad layer 4 has a mesa structure.

The conventional AML device, although it may vary depending on the sort of current shielding layers, requires five re-growth steps that include layer growth for forming diffraction gratings, a growth for a mesa-etching, a current shielding layer growth, a p-clad layer growth. And an insulating layer growth for isolating between devices are required. While the re-growth steps are increased, a planarization degree of a surface may be lowered and a significant alignment error may occur during a photolithography process. In the case of an electro-absorption modulator integrated distributed-feedback laser (EML) or an AML device, it is required to minimize the reflection at an optical output facet, since a far field pattern (hereinafter, simply referred to as "FFP") is significantly distorted due to an irregular surface of a window area. That is, if the total thickness of the window area is thin, a beam reflected from a surface of the window area interferes with a linear beam so that not only is a side lobe created, but also an offset phenomenon causing a peak value to be biased to 0 may occur. Therefore, it is necessary to form a p-clad layer with a relatively large thickness. However, if the thickness of the p-clad layer increases, serial resistance of the device also increases. Thus, the above structure may inevitably cause an increase of serial resistance due to the large thickness of the p-clad layer. Particularly, in the case of a device operating at a high speed above 10 Gb/s, an RF characteristic of the device may be deteriorate.

SUMMARY OF THE INVENTION

Accordingly, the present invention has been made to solve the above-mentioned problems occurring in the prior art and provides additional advantages, by providing a photonic integrated device using a reverse-mesa structure, and a method for fabricating the same, that is capable of simplifying a fabricating process for the photonic integrated device by simplifying an epitaxy process.

Another aspect of the present invention is to provide a photonic integrated device using a reverse-mesa structure and a method for fabricating the same that is capable of improving an RF characteristic by reducing the serial resistance of a device.

Still another aspect of the present invention is to provide a photonic integrated device using a reverse-mesa structure and a method for fabricating the same that is capable of improving FFP distribution in a vertical direction of a beam.

In one embodiment, a photonic integrated device using a reverse-mesa structure is provided and includes a first conductive substrate on which a semiconductor laser, an optical modulator, a semiconductor optical amplifier, and a photo detector are integrated; a first conductive clad layer and an active layer sequentially formed on the first conductive substrate in the form of a mesa structure; a second conductive clad layer formed on the active layer in the form of a reverse-mesa structure; an ohmic contact layer formed on the second clad layer in such a manner that the ohmic contact layer has a width narrower than the width of an upper surface of the second conductive clad layer; a current shielding layer filled in a sidewall having a mesa and reverse-mesa structure; and at least one window area formed between the above elements.

According to another embodiment of the present invention, the window area is overgrown relatively to a surface of the ohmic contact layer.

Yet in another embodiment, there is provided a method for forming a photonic integrated device using a reverse-mesa structure, the method comprising the steps of: sequentially forming a first conductive substrate, an active layer, a second conductor clad layer and an ohmic layer on a substrate on which a semiconductor laser, an optical modulator, a semiconductor optical amplifier, and a photo detector are integrated; etching the ohmic contact layer such that at least a part of the second conductive clad layer is exposed; forming a mesa mask pattern on the second conductive clad layer such that the mesa mask pattern surrounds a whole area of the ohmic contact layer; performing an etching process by using the mesa mask pattern in such a manner that the second conductive clad layer is etched in a reverse-mesa structure and the active layer and the first conductive clad layer are etched in a mesa structure; and forming a current shielding layer such that a sidewall having a mesa and reverse mesa structure are filled with the current shielding layer.

A BRIEF DESCRIPTION OF THE DRAWINGS

The above features and advantages of the present invention will be more apparent from the following detailed description taken in conjunction with the accompanying drawings, in which.

A DETAILED DESCRIPTION

Hereinafter, the embodiments of the present invention will be described with reference to the accompanying drawings. For the purposes of clarity and simplicity, a detailed description of known functions and configurations incorporated herein will be omitted as it may make the subject matter of the present invention unclear.

FIGS. 2A to 2F are sectional views showing a fabricating process for an AML device having a buried hetero structure according to one embodiment of the present invention.

Figure 1:
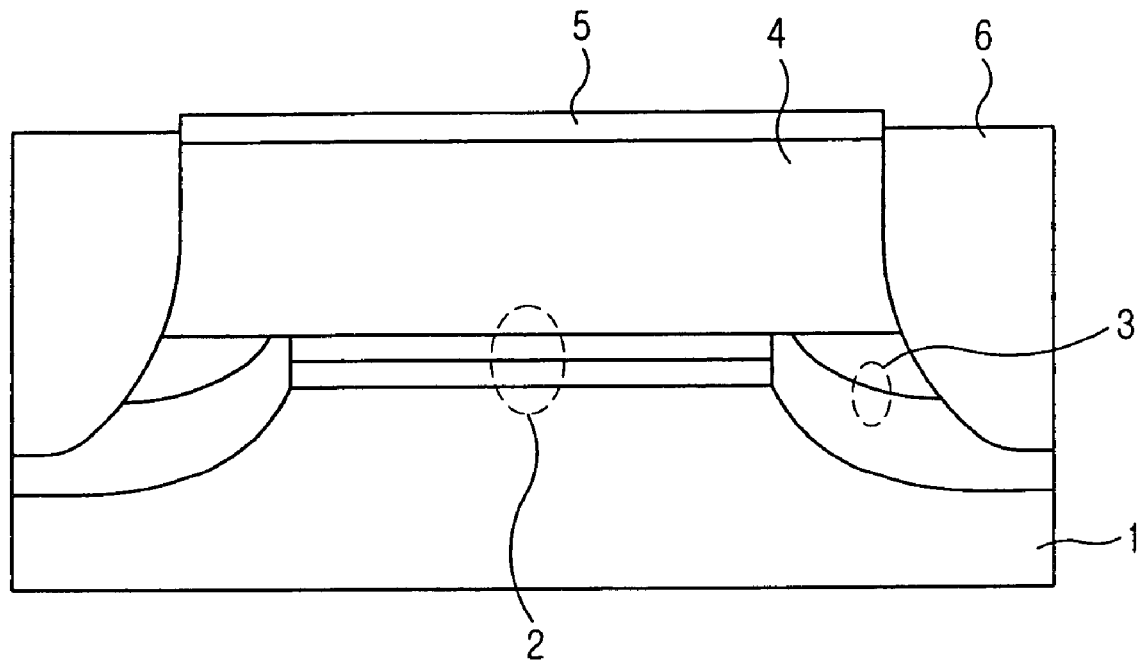
FIG. 1 is a sectional view showing a conventional AML device having a buried hetero structure.
Figure 2A:
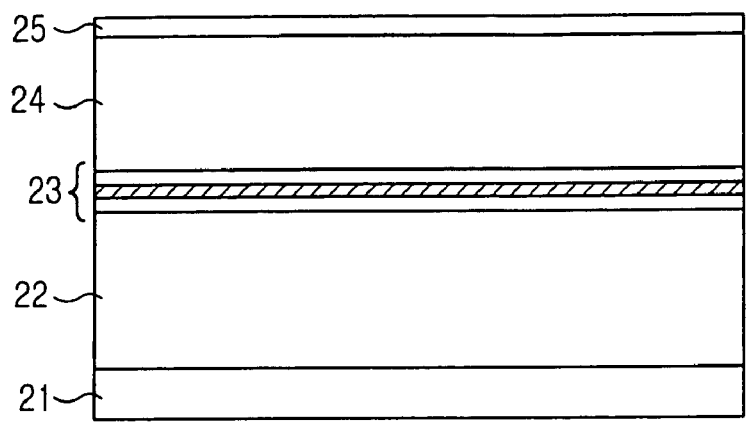
FIGS. 2A to 2F are sectional views showing a fabricating process for an AML device having a buried hetero structure according to one embodiment of the present invention.

Referring to FIG. 2A, an $n^+$-InP clad layer 22, an InGaAsP active layer 23, a $p^+$-InP clad layer 24, and an InGaAsP ohmic contact layer 25 are sequentially grown from an upper surface of an $n^+$-InP substrate 21.

Figure 2B:
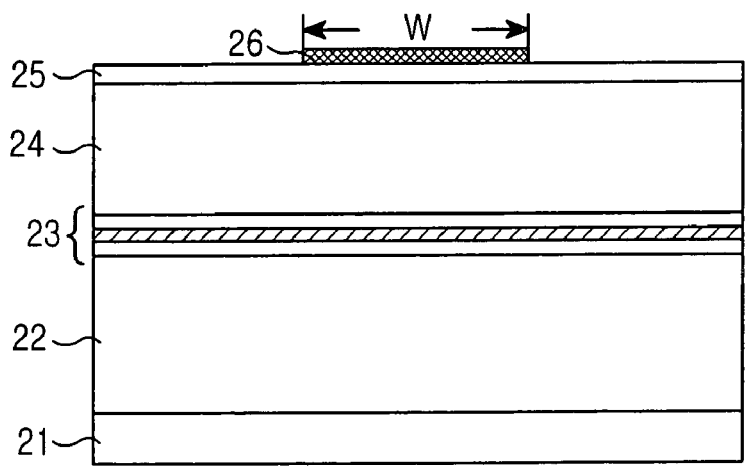

Referring to FIG. 2B, a first $SiO_2$ mask 26 has a width of about 2.5 µms formed on the InGaAsP ohmic contact layer 25.

Figure 2C:
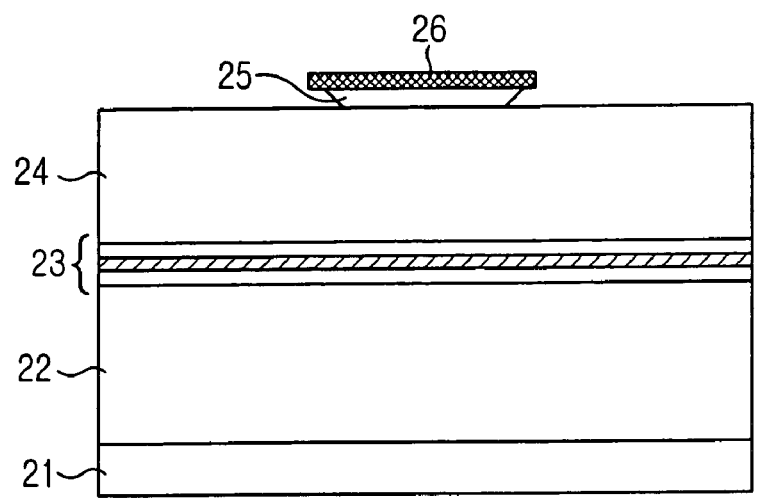

Referring to FIG. 2C, the InGaAsP ohmic contact layer 25 formed below the first $SiO_2$ mask 26 is wet-etched by using selective etchant including $H_3PO_4$, $H_2O_2$ and $H_2O$ mixed in a ratio of 1:1:5 in such a manner that the InGaAsP ohmic contact layer 25 has a width of 2 µm.

Figure 2D:
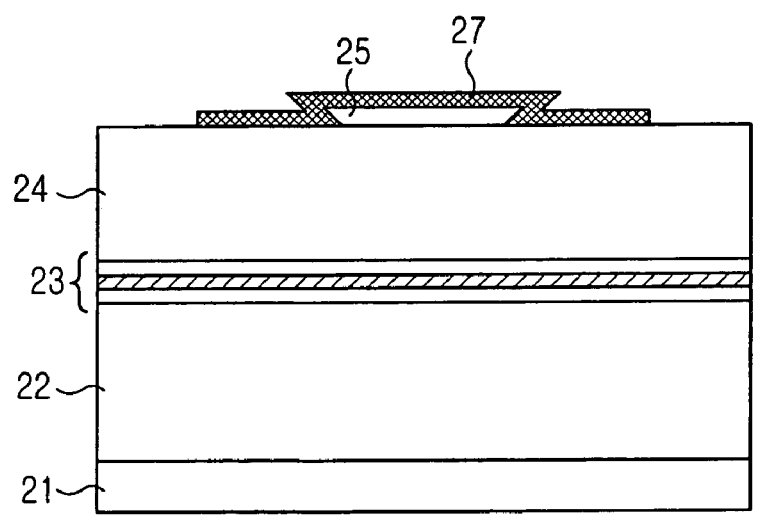

Referring to FIG. 2D, a second $SiO_2$ mask 27 having a width of about 5 µm is formed on the InGaAsP ohmic contact layer 25 after the first $SiO_2$ mask 26 has been removed from the InGaAsP ohmic contact layer 25.

Figure 2E:
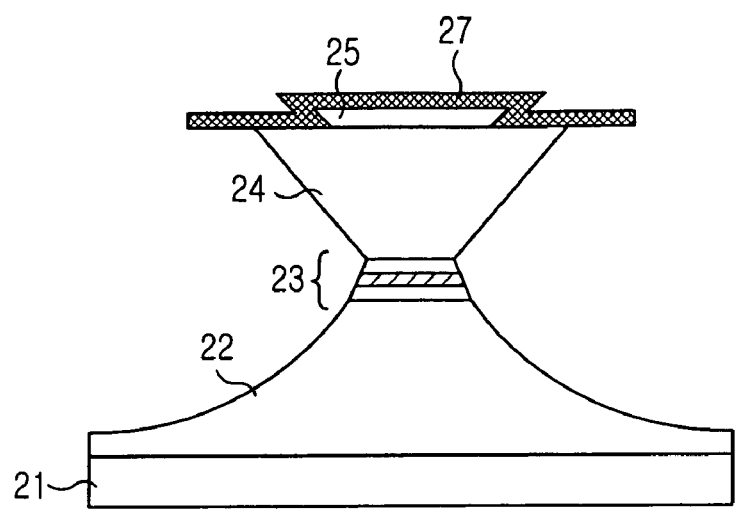

Referring to FIG. 2E, after a vertical mesa structure has been preliminarily formed in the AML device with a depth of about 3 µm through a dry etching process by using the second $SiO_2$ mask 27 as an etching mask to cause the vertical mesa structure to reach an active layer, an etching process is further carried out by using non-selective etchant including HBr, $H_2O_2$ and $H_2O$ mixed in a ratio of 10:2:100. As the result of the above etching processes, the $p^+$-InP clad layer 24 has a reverse-mesa structure and the $n^+$-InP clad layer 22 and the InGaAsP active layer 23 have mesa structures. Herein, the reverse mesa structure is formed by utilizing a characteristic of the wet etching process, in which the reaction between a structure and etchant is significantly lowered when a crystal face of (111)B is presented. Because of the specific property of InP materials, the structure is etched at an angle of 60°. After the $p^+$-InP clad layer 24 has been etched in the reverse-mesa structure, the InGaAsP active layer 23 is etched in a mesa structure instead of the reverse-mesa structure because the InGaAsP active layer 23 has a composition different from the composition of the $p^+$-InP clad layer 24. In addition, a structure shown in FIG. 2E can be achieved by performing only a wet etching process; thus, it is preferable to carry out the wet etching process together with the dry etching process in order to reduce the process time. Furthermore, in order to reduce serial resistance within the device, it is necessary to reduce the thickness of the $p^+$-InP clad layer 24 that is formed between the active layer 23 and the InGaAsP ohmic contact layer 25. Although it is possible to use a $p^+$-InP clad layer having a large thickness, it is advantageous to use a $p^+$-InP clad layer having a thin thickness, for example, 0.8 to 2.0 µm, in order to achieve a desired serial resistance characteristic and a superior RF response characteristic. According to the present embodiment, the $p^+$-InP clad layer 24 has a thickness of about 1.4 µm.

Figure 2F:
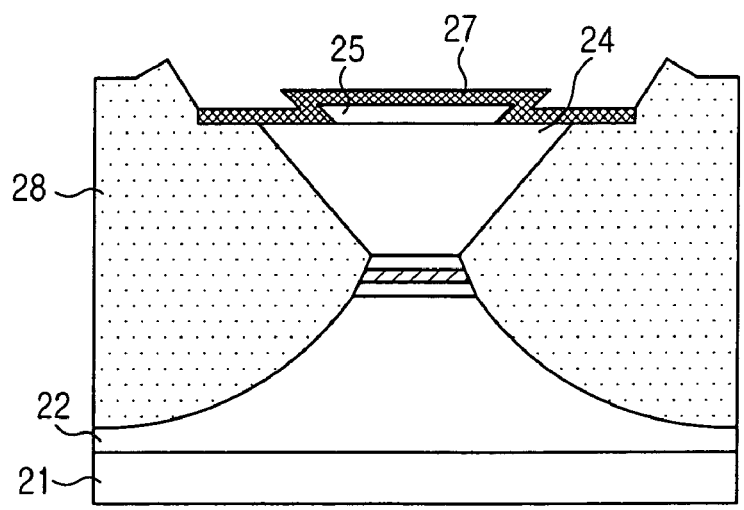

Referring to FIG. 2F, a Fe-doped InP layer 28 is formed on a sidewall of the AML device having reverse-mesa and mesa structures in order to shield current and to be electrically isolated between devices. Transitional metal, such as Fe, Co, Cr, Mn, or Ti, is used as dopant allowing the InP material to have a semi-insulating characteristic. According to the present embodiment, the InP layer 28 is doped with Fe for the purpose of small current leakage.

Meanwhile, the reverse-mesa structure in the form of an etched mesa buried hetero-structure as shown in FIGS. 2A to 2F may be capable of reducing the serial resistance. However, according to the above-mentioned window structure, the beam radiated from a tip may be reflected from the surface of the window structure due to the clad layer having a thin thickness. Such a reflected beam may interfere with the linear beam and lower the FFP efficiency. In addition, the thickness of the window area must be increased because an offset angle may vary sensitively to the thickness.

Figure 3:
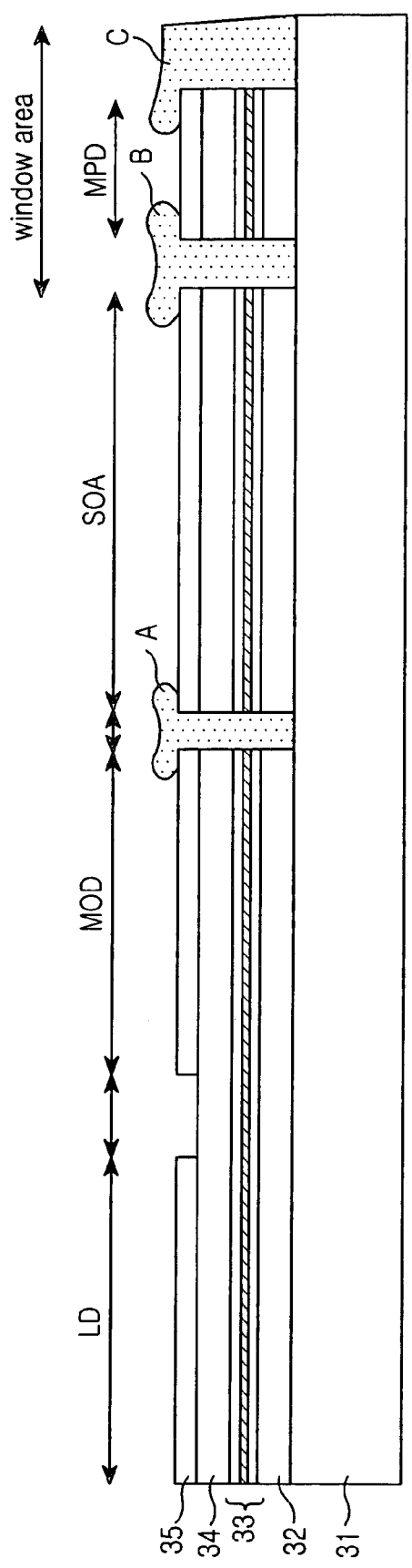
FIG. 3 is a schematic sectional view of an AML device according to another embodiment of the present invention in which an overgrowth is applied to a window area.
Figure 4:
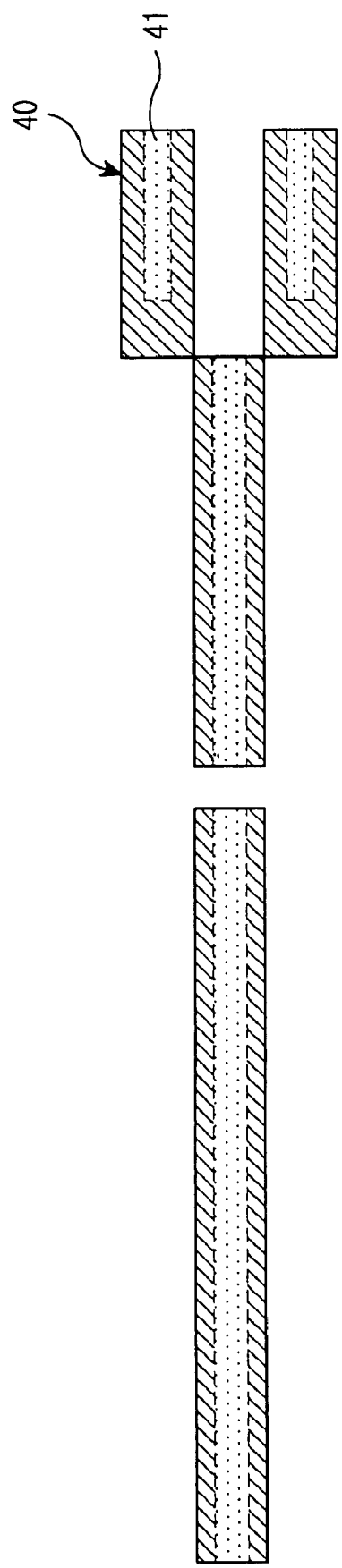
FIG. 4 is a layout view of a photo mask for applying an overgrowth to a window area as shown in FIG. 3; and, FIG. 5 is a view showing a reflection degree of a beam at a surface of a window area when an overgrowth is applied to the window area in comparison with a reflection degree of a beam at a surface of a window area of a prior art whereas the overgrowth is not applied to the window area.

FIG. 3 is a schematic sectional view of an AML device according to another embodiment of the present invention in which an overgrowth is applied to a window area, and FIG. 4 is a layout view of a photo mask for applying the thick-overgrowth to the window area as shown in FIG. 3.

Referring to FIG. 3, the AML device includes a laser diode (LD), a modulator (MOD), a semiconductor optical amplifier (SOA) and a monitor photo diode (MPD) stacked on a substrate 31. An attenuation window—that is, an isolation area A—is formed between the modulator (MOD) and the semiconductor optical amplifier (SOA). In order to reduce optical feedback at an optical output facet, window areas B and C are formed between a tip of the semiconductor optical amplifier (SOA) and the optical output facet. The isolation area A and the window areas B and C are thickly overgrown.

Hereinafter, a manufacturing process for the AML device will be described.

Referring to FIGS. 3 and 4, an $n^+$-InP clad layer 32, an active layer 33, a $p^+$-InP clad layer 34, and an InGaAsP ohmic contact layer 35 are sequentially grown from an upper surface of an $n^+$-InP substrate 31, which is identical to a fabrication process shown in FIG. 2A.

Then, a first $SiO_2$ mask having a width of about 2.5 µm is formed on the InGaAsP ohmic contact layer 35 (see FIG. 2B) and the InGaAsP ohmic contact layer 35 formed below the first $SiO_2$ mask is wet-etched in such a manner that the InGaAsP ohmic contact layer 35 has a width of 2 µm (see FIG. 2C.) In addition, after removing the first $SiO_2$ mask, a second $SiO_2$ mask having a width of about 5 µm is formed on the InGaAsP ohmic contact layer 35 (see FIG. 2D) and a wet and dry etching process is carried out so as to form a reverse-mesa structure (see FIG. 2E).

Subsequently, as shown in FIG. 4, a mask pattern for an overgrowth is formed on the InGaAsP ohmic contact layer 35 by using a photo mask 40 having opening sections corresponding to window areas A, B and C (see FIG. 3.).

Then, an InP layer is re-grown from the window areas A, B and C with a large thickness and Fe is doped into the window areas A, B and C in order to form a current shielding/isolation layer.

Figure 5:
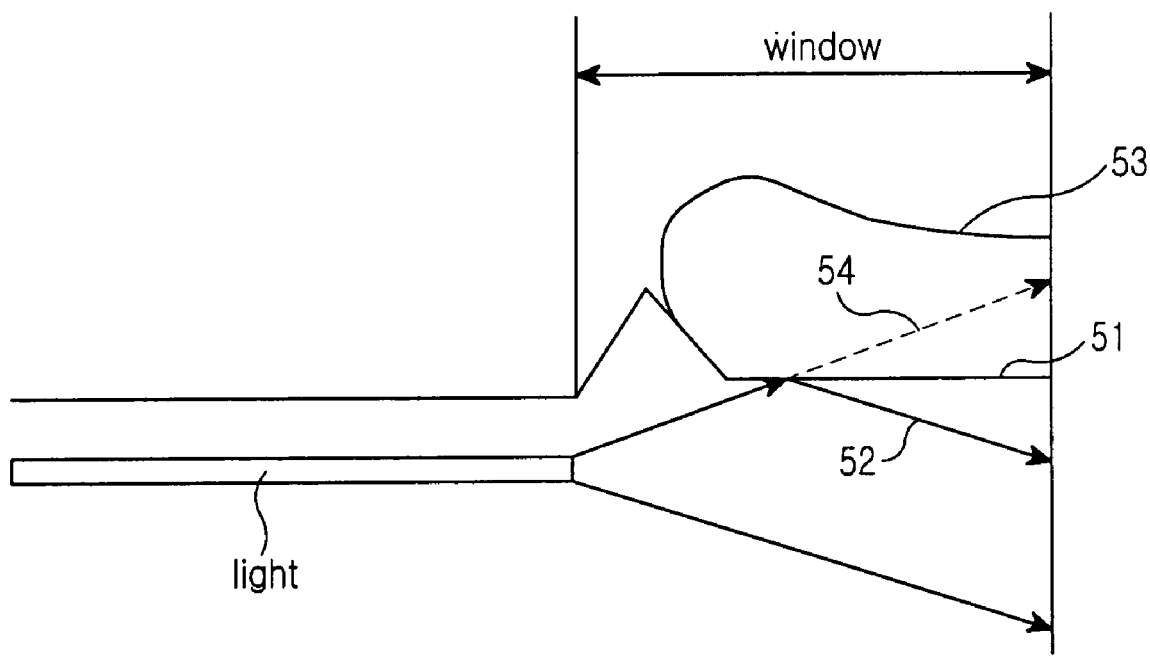

FIG. 5 shows a reflection degree of a beam at a surface of a window area when an overgrowth is applied to the window area, in comparison with a reflection degree of a beam at a surface of a window area of a prior art where the overgrowth is not applied to the window area.

Referring to FIG. 5, if the window area has a planar surface 51, the light is reflected from the surface of the window area as indicated by an arrow 52. However, according to the present invention, the window area has an overgrowth section 53 so that the light is not reflected from the surface of the window area but passes straight ahead as indicated by an arrow 54. Thus, an offset angle is reduced and interference can be minimized advantageously, so that the FFP in the form of a multi-lobe is changed into the FFP in the form of a single-lobe.

As described above, the photonic integrated device having the reverse-mesa structure and a method for fabricating the same according to the present invention can form the active layer and the clad layer through a one-step growing process. In addition, since the current shielding/isolation layer is grown after the reverse-mesa structure has been formed, the re-growth process can be simply completed through three fabrication steps.

In addition, since the clad layer can be formed with a thin thickness, serial resistance can be significantly reduced and thermal characteristics of the device can be improved while ensuring superior RF characteristics in an operational frequency range above 10 GHz.

Furthermore, the multi-lobe FFP can be changed into the single-lobe FFP by increasing the thickness of the window area, so the coupling efficiency with respect to optical fibers can be improved drastically.

While the instant invention has been shown and described with reference to the above embodiments thereof, it will be understood by those skilled in the art that various changes in form and details may be made therein without departing from the spirit and scope of the invention as defined by the appended claims.

What is claimed is:

1. A method for forming a photonic integrated device using a reverse-mesa structure, the method comprising the steps of:
   i) sequentially forming a first conductive clad layer, an active layer, a second conductor clad layer and an ohmic layer on a substrate on which a semiconductor laser, an optical modulator, a semiconductor optical amplifier, and a photo detector are integrated;
   ii) etching the ohmic contact layer such that at least a part of the second conductive clad layer is exposed;
   iii) forming a mesa mask pattern on the second conductive clad layer and the ohmic contact layer such that the mesa mask pattern is in a direct contact with an upper surface and a side surface of the ohmic contact layer;
   iv) performing an etching process by using the mesa mask pattern in such a manner that the second conductive clad layer is etched in a reverse-mesa structure and the active layer and the first conductive clad layer are etched in a mesa structure; and,
   v) forming a current shielding layer such that a sidewall having a mesa and reverse mesa structure is filled with the current shielding layer.

2. The method as claimed in claim 1, wherein step i) is carried out through a one-step semiconductor re-growth process.

3. The method as claimed in claim 1, wherein step ii) includes the substeps of forming a mask pattern having a width wider than the size of the ohmic contact layer on the ohmic contact layer and etching the ohmic contact layer such tat the ohmic contact layer has a predetermined size by performing a selective etching process.

4. The method as claimed in claim 1, wherein step iv) includes the substeps of etching the second conductive clad layer and the active layer through a dry etching process by using the mesa mask pattern, and etching the second conductive clad layer, the active layer and the first conductive clad layer through a wet etching process in which reaction between a structure and etchant is significantly lowered when a crystal face (111)B of the second conductive clad layer is presented.

5. The method as claimed in claim 4, wherein the second conductive clad layer includes a p$_+$-InP clad layer, and the etchant used in the wet etching process includes HBr, $H_2O_2$ and $H_2O$ mixed in a ratio of 10:2:100.

6. The method as claimed in claim 5, wherein the second conductive clad layer is etched such that an etching surface thereof is inclined by 60° with respect to an upper surface of the first conductive substrate.

7. The method as claimed in claim 1, wherein step v) includes the substeps of forming a window mask pattern used for overgrowing the window area on the ohmic contact layer by using a photo mask having an opening section corresponding to the window area to be overgrown after forming the reverse-mesa and mesa structures, forming a semiconductor layer on the window area with a large thickness, and doping dopant into the semiconductor layer such that the semiconductor layer has a semi-insulating characteristic.

8. The method as claimed in claim 7, wherein the dopant includes a transition metal selected from the group consisting of Fe, Co, Cr, Mn and Ti.

9. The method as claimed in claim 8, wherein the dopant include Fe.

10. The method as claimed in claim 5, wherein the second conductive clad layer has a thickness of about 0.8 to 2.0 μm in order to achieve a serial resistance characteristic of a device or a superior RE response characteristic.

11. The method as claimed in claim 10, wherein the second conductive clad layer has a thickness of about 1.2 to 1.6 μm.

12. The method as claimed in claim 1, wherein the ohmic contact layer is etched in step (ii) such that the ohmic contact layer has the reverse mesa structure.

13. The method as claimed in claim 10, wherein the mesa mask pattern is formed on the second conductive clad layer in step (iii) such that the mesa mask pattern is in a direct contact with the second conductive clad layer.

* * * * *